(12) United States Patent
Lindstedt et al.

(10) Patent No.: US 7,057,224 B2
(45) Date of Patent: Jun. 6, 2006

(54) SEMICONDUCTOR MEMORY HAVING AN ARRANGEMENT OF MEMORY CELLS

(75) Inventors: Reidar Lindstedt, München (DE); Dirk Fuhrmann, München (DE)

(73) Assignee: Infineon Technologies AG, Munich (DE)

( * ) Notice: Subject to any disclaimer, the term of this patent is extended or adjusted under 35 U.S.C. 154(b) by 210 days.

(21) Appl. No.: 10/731,109

(22) Filed: Dec. 10, 2003

(65) Prior Publication Data

US 2004/0135190 A1    Jul. 15, 2004

(30) Foreign Application Priority Data

Dec. 10, 2002    (DE)    ................. 102 57 665

(51) Int. Cl.
H01L 27/108    (2006.01)
H01L 29/76    (2006.01)
H01L 29/94    (2006.01)
H01L 31/119    (2006.01)

(52) U.S. Cl. .................................... 257/302

(58) Field of Classification Search ................. 257/302
See application file for complete search history.

(56) References Cited

U.S. PATENT DOCUMENTS

| | | | |
|---|---|---|---|
| 6,010,953 A | | 1/2000 | Prall |
| 6,097,621 A | * | 8/2000 | Mori ........................... 365/63 |
| 6,166,941 A | * | 12/2000 | Yoshida et al. ............... 365/63 |
| 2002/0130384 A1 | * | 9/2002 | Aton ........................... 257/510 |

FOREIGN PATENT DOCUMENTS

JP    10189919 A    7/1998

* cited by examiner

*Primary Examiner*—Howard Weiss
(74) *Attorney, Agent, or Firm*—Edell, Shapiro & Finnan, LLC

(57) ABSTRACT

A semiconductor memory can have first lines to which memory cells are connected and that run divergently with respect to one another, and second lines to which the memory cells are connected that are curved. Combining the geometry of the memory cell array with storage capacitors laterally offset allows signal delays along word lines and bit lines to be aligned regardless of the position of a memory cell in the memory cell array. The geometry of the memory cell array allows short signal propagation times to be attained particularly along the first lines, which are divergent with respect to one another, this simplifying error-free operation of a semiconductor memory particularly at high clock frequencies.

29 Claims, 4 Drawing Sheets

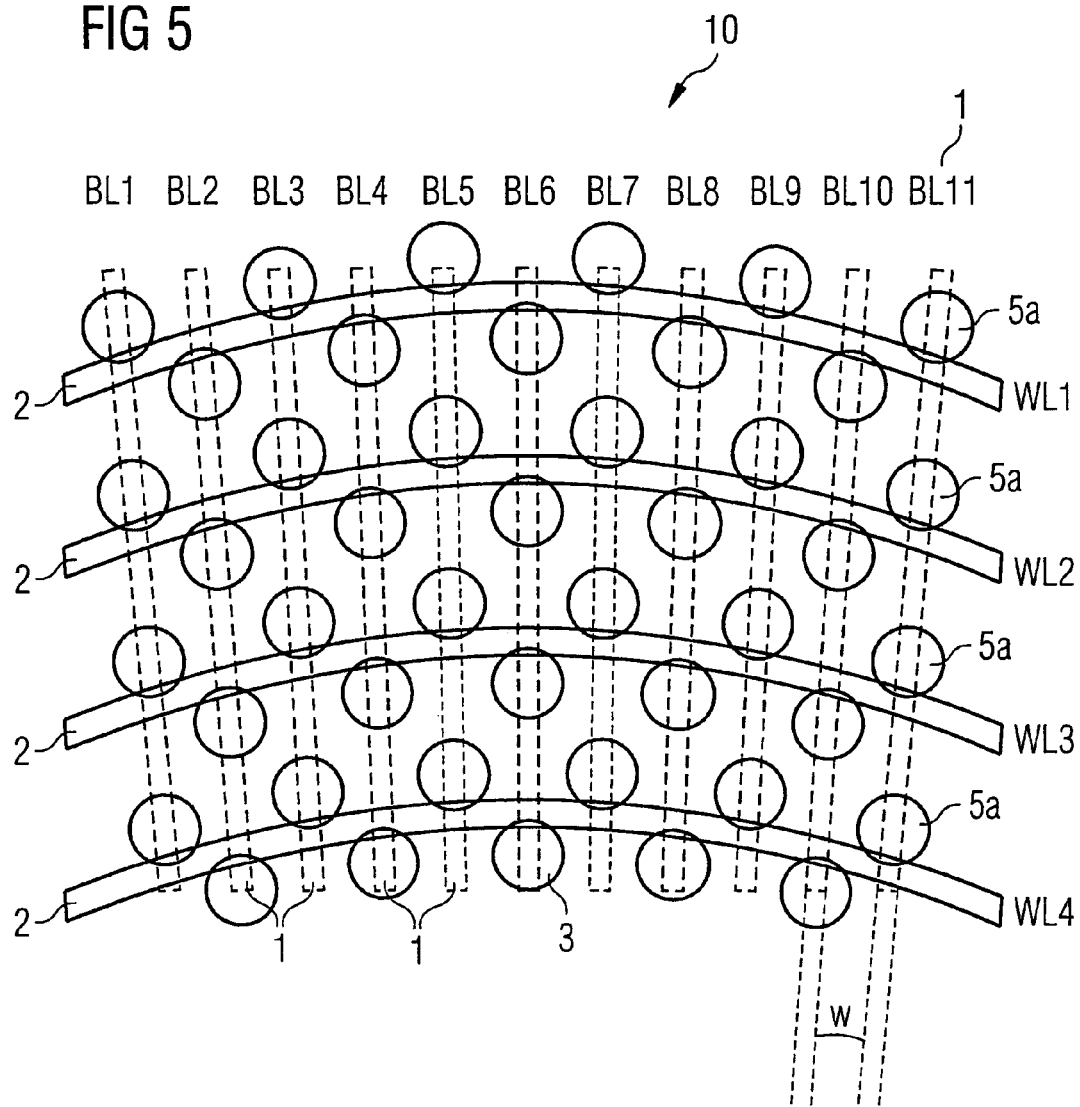

SEMICONDUCTOR MEMORY HAVING AN ARRANGEMENT OF MEMORY CELLS

CROSS-REFERENCE TO RELATED APPLICATION

This application claims priority from German Patent Application No. 10257665.3, entitled "Semiconductor Memory Having an Arrangement of Memory Cells" and filed on Dec. 10, 2002, the disclosure of which is incorporated herein by reference in its entirety.

FIELD OF THE INVENTION

The present invention relates to semiconductor memory having an arrangement of memory cells which are connected to first lines and to second lines, which cross the first lines, and which each have a storage capacitor and a vertical selection transistor.

BACKGROUND

DRAMs (dynamic random access memory) and other volatile semiconductor memories are constructed in this manner. They have a memory cell array whose memory cells each have a storage capacitor for storing charges and a selection transistor. Each memory cell is actuated by a first line (for example, a bit line) and a second line (e.g., a word line), which runs at right angles or obliquely to the first line over the semiconductor substrate and crosses the first line. By altering the electrical potentials on the first and/or the second line, the selection transistor can be switched, so that a certain quantity of charge can flow into or out of the storage capacitor.

Selection transistors are usually in the form of MOSFETs (metal oxide semiconductor field effect transistor), the first source/drain electrode of which is connected to a bit line and the gate electrode of which is connected to a word line. The second source/drain electrode is routed to the storage capacitor. In view of the increasing integration density of future semiconductor memories, the selection transistors are produced in the form of vertical transistors whose two source/drain electrodes are arranged one above the other vertically with respect to the substrate surface. This means that the selection transistor requires only a minimal substrate base area. In vertical selection transistors, the gate electrode is arranged with just a slight lateral offset and at a central level between the two source/drain electrodes of the transistor. By contrast, planar selection transistors, whose electrodes are arranged laterally next to one another on the substrate surface, require a much larger substrate base area.

The cell array of a semiconductor memory contains storage capacitors arranged, with respect to the base area of the semiconductor substrate, in direct proximity to the crossing point between the bit line and the word line, which actuate the memory cell in question. In line with the usual network-type arrangement of mutually parallel bit lines and mutually parallel word lines, which usually run at right angles to the bit lines over or in the substrate base area, the memory cells and hence also the storage capacitors are arranged on the substrate in the manner of a chessboard, for example. At least one edge of the cell array is provided with connections for the word lines crossing the bit lines. In the case of a real cell array architecture, by contrast, the bit lines no longer cross all the word lines, but rather just a few of them to keep down the bit line capacitance and to simplify the reading of an information item from a memory cell. Various groups of word lines therefore cross different groups of bit lines, which means that a plurality of cell blocks are produced, instead of a single cell array. For word lines and bit lines, corresponding driver circuits, i.e., word line drivers or evaluation circuits for bit lines, are used.

During operation of a semiconductor memory, time delays arise which vary depending on the length of the lines via which electrical signals are transported. Since semiconductor memories are operated at an increasing clock rate, the time delays for various signals can be controlled and coordinated with respect to one another. In particular, time delays caused by different line lengths need to be significantly below the clock rate at which a semiconductor memory is operated in order to ensure that memory operation works correctly. However, increased clock rates, i.e., ever shorter intervals of time between clock pulses, mean that the increased size of memory cell arrays results in errors on account of different line lengths, particularly in word lines and bit lines. The more memory cells are connected to a single word line or bit line, the greater the time difference for a signal, which is produced via these lines when writing or reading to or from the memory cells or when activating or deactivating rows of memory cells. Since word lines and bit lines are connected (by a driver circuit) to a logic area, which controls the operation of the memory cell array, the signal delays vary approximately proportionally to the distance between a memory cell addressed via a line and the logic area. Thus, for example, memory cells arranged close to a bit line driver tend to be read more quickly than memory cells which are situated at the opposite end of the bit line. The same applies to the signal propagation along word lines. Particularly in the case of radio frequency circuits, which are operated at clock rates in the gigahertz range, the correct operation of a semiconductor memory requires particularly uniform signal delays.

SUMMARY

In a semiconductor memory for at least one type of supply line to the memory cells (bit lines or word lines), the signal delays caused by the line lengths can fluctuate less with the position of a memory cell in the memory cell array. The signal delays can be relatively homogeneous and shorter, as an average over all memory cells. The number of memory cells, which are actuated when connected per word line or per bit line, can be altered, and thus, can create additional potential for optimizing line lengths and signal delay times for word lines or bit lines.

A semiconductor memory in which the memory cells form at least one memory cell array can include first lines that run divergently with respect to one another and the second lines that are curved. A memory cell can be connected at each crossing point between a first line and a second line, and each of the first lines has memory cells connected to it whose storage capacitors are arranged to be laterally offset, alternately on both sides of the respective first line.

Alternately, a semiconductor memory in which the memory cells form at least one memory cell array can include first lines that run divergently with respect to one another and the second lines that are curved. A memory cell can be connected at each crossing point between a first line and a second line, and each of the second lines have memory cells connected to it whose storage capacitors are arranged to be laterally offset, alternately on both sides of the respective second line.

A common feature of the two semiconductor memories is that first lines used for actuating the memory cells do not run parallel to one another, but rather divergently and that the second lines, which cross the first lines, are curved. This makes it possible to surround a logic area with a memory area on more than just one side, which means that a memory area can be arranged annularly, for example, around a logic area, which is arranged in the center. According to the scope of such a memory area running in annular fashion around a logic area, it is possible to provide a relatively large number of first lines (word lines or bit lines) running radially outward, the great number of these lines meaning that they can be in relatively short form, so that signal delays along these lines are small. If a memory cell array has a large number of radially running first lines, the number of memory cells actuated by a respective single first line can be chosen to be very small, as a result of which the signal delays in the first lines are very homogeneous and small. This means that the access times for the individual memory cells are less dependent on the position of a memory cell along a first line and are also shorter overall. Thus, a memory cell which is arranged physically close to the logic area can have information written to it and read from it just as reliably as a memory cell which is arranged at a great distance from the logic area; the signal propagation times vary less greatly as a function of the physical distance between the memory cells and the logic area, which means that the semiconductor memory can be operated more certainly without error, particularly at high clock frequencies.

Each crossing point between a first and a second line to can have a memory cell connected to it and for, in respect of a line type (in respect of either the first or the second lines), the storage capacitors for the memory cells can be connected to these lines to be laterally offset alternately on both sides of the respective line to which the memory cells are connected. Along a line type, the storage capacitors are thus offset alternately on the left of the line and on the right of the line to which they are connected and are not arranged centrally above or below this line. Viewed from above the respective line, the storage capacitors laterally offset in this manner are offset in the form of a zigzag line relative to the line. This feature increases the memory cell density along the corresponding line. The distance between memory cells, which are most closely adjacent to one another, is concomitantly determined by the cross section of the storage capacitors. A lateral offset alternately in both directions transversely with respect to the line allows the capacitors for the memory cells along the line to be compressed and in this way allows the memory cell density along this line to be increased.

Combining a memory cell array in which first lines running divergently with respect to one another exist and the compression, brought about by alternate lateral offsets, of memory cells along at least one type of line brings about homogeneous signal delay times which permit higher clock rates and a higher probability of error-free operation for a semiconductor memory than in the case of conventional memory cell arrays of rectangular design.

In one implementation of the semiconductor memory, with the memory cell density along the first lines, i.e., along the divergently running lines, can be increased by alternate lateral offsets for the storage capacitors. This results in further enhancement along the first lines, whose divergent path in various directions, i.e., from 0 to 360° on the wafer surface, starting from a logic area means that they can be arranged in large numbers and can therefore be in very short form. Along the line path of the first lines, for example, from an internal radius of an annular memory cell array to the latter's external radius the alternate lateral offsets mean that a relatively large number of memory cells can be connected.

By contrast, another implementation of the semiconductor memory, the storage capacitors are laterally offset alternately relative to the second lines, i.e., relative to the curved lines. This means that, for a prescribed number of memory cells connected by a respective curved second line, the length of this curved line can be shortened. If a memory cell array is in the form of an annular section surrounding a logic area just in a certain angular range, for example, then the angle of azimuth which the memory cell array takes up can be chosen to be smaller, and a plurality of such memory cell arrays can be provided, than when the storage capacitors are arranged centrally above or below the curved lines.

In line with the invention, the capacitors for the memory cells connected either to the first lines or to the second lines are thus laterally offset alternately on both sides of either the first lines or the second lines. In this way, a single first or second line can actuate two rows of memory cells. Provision is preferably made for the storage capacitors for the memory cells connected to a single line, e.g., a word line, to be arranged alternately on one side of this word line and on the other side of this word line. The word line thus runs in the center between two rows of memory cells, which are both actuated by this single word line.

Shortening first or second lines by laterally offsetting storage capacitors alternately firstly has the advantage that fewer drivers are required for operating these lines; secondly, provided that the lithographical resolution limit for the first and second lines so permits, it is possible to arrange additional lines, for example, control lines or auxiliary lines, between mutually adjacent (first or second) lines which respectively actuate two rows of memory cells. By way of example, it is conceivable to equip the word lines with a respective additional parallel line to increase their conductivity. The number of drivers required for the second lines is not increased as a result.

In the case of the semiconductor memory in accordance with the invention, the number of memory cells which are connected to a word line or to a bit line per line length has been altered as compared with a conventional semiconductor memory. The altered ratio, achieved by the inventive arrangement of the cell density along the word lines and along the bit lines in the memory cell array, provides additional potential for optimizing the line lengths on a semiconductor substrate. Altering the number of memory cells connected per word line or bit line also affords the option of optimizing not only the length, but also the capacitance of word lines and bit lines.

The first lines can extend divergently from a logic area to the memory cells in at least one memory cell array. In this case, the logic area can be surrounded azimuthally by one or a plurality of memory cell arrays.

In particular, the memory cells can form at least one memory cell array, which is in the form of an annular portion, and in which the first lines diverge radially and the second lines are curved arcuately. In the case of this annular structure including one or more memory cell arrays, memory cells are at a distance from the logic area, which varies less greatly with the position of a memory cell in the memory cell array than in the case of a conventional memory cell array of rectangular or square design, which needs to be connected to a logic area from two edges of the memory cell array.

One or more memory cell arrays can surround a logic area annularly. In particular, a plurality of memory cell arrays in the form of annular portions can be separated by interspaces in an angle of azimuth whose magnitude can be chosen arbitrarily but is preferably just a few degrees, for example, no more than 5°. In the interspaces, the curved lines can be connected to the logic area. In addition, these interspaces can contain other lines, for example, for power supplies.

An implementation can provide for the first lines to be bit lines and for the second lines to be word lines. In this case, the bit lines, which directly forward the quantity of charge, which is to be evaluated as a data bit for the purpose of writing to and reading from memory cells, are divergent and are short as compared with the word lines, which reduces read or write errors. The memory cells arranged in compressed form along the radially divergent bit lines can be operated without any significant discrepancies in the signal delays when reading the bit lines.

Alternatively, the first lines can be word lines and the second lines can be bit lines. In this example, the word lines can have a radially divergent path and the second lines can have a curved path, for example, in concentric circles or arcuate sections. Although the bit lines can be longer than the word lines in this embodiment, the memory cells can be compressed along the curved bit lines by laterally offsetting them relative to the bit lines. This offset can compensate for the greater line length of the curved bit lines. An increase in the memory cell density as a result of alternate lateral offsets can also provide above-described advantages on the respective other line type (the divergent lines or the curved lines.

Any two memory cells, which are connected to the same word line and whose storage capacitors are adjacent to one another along this word line, can be connected to two mutually adjacent bit lines. As a result, in a semiconductor memory in whose memory cell array each crossing point between a word line and a bit line makes contact with a memory cell, the memory cells can be read by comparing the bit line pairs of two respective bit lines, which are most closely adjacent to one another (folded bit line).

Storage capacitors can be trench capacitors buried in a semiconductor substrate. The capacitors can be arranged in a deep trench and can be fabricated by first depositing the capacitor dielectric on the trench wall in the deep trench and then introducing a filling as the inner capacitor electrode. The outer electrode can be formed by a diffused layer in the doped semi-conductor substrate, which surrounds the deep trench.

As an alternative, film capacitors can be stacked above the semiconductor substrate.

The selection transistors can be field effect transistors, particularly, MOSFETs. Gate electrodes can be connected to the word lines. The top source/drain electrodes of the vertical selection transistors can be connected to the bit lines; the bottom source/drain electrodes can be conductively connected to the internal electrode of the capacitor.

In one embodiment, at least one further logic area, which is not surrounded by memory areas, can be provided on the semiconductor substrate and can be arranged between a memory area and an edge of the semiconductor substrate. This further logic area can be arranged, for example, at a chip edge or in a corner of the semiconductor chip. Further logic area(s) can be arranged between mutually adjacent memory areas. These logic areas form sub-regions of a logic circuit, which is used for operating the semiconductor memory, particularly for actuating the memory cell arrays. Those sub-regions of the logic circuit from which the connection to all memory cells can be as relatively uniformly short as possible can be arranged in the center of the semiconductor chip.

The semiconductor memory can be a volatile semiconductor memory, particularly a DRAM.

BRIEF DESCRIPTION OF THE DRAWINGS

The invention is described below with reference to FIGS. 1 to 5, in which:

FIG. 5 shows a detail view of a second embodiment of a semiconductor memory in accordance with the invention.

Like reference numerals in the various drawings indicate like elements.

DETAILED DESCRIPTION

Figure 1:
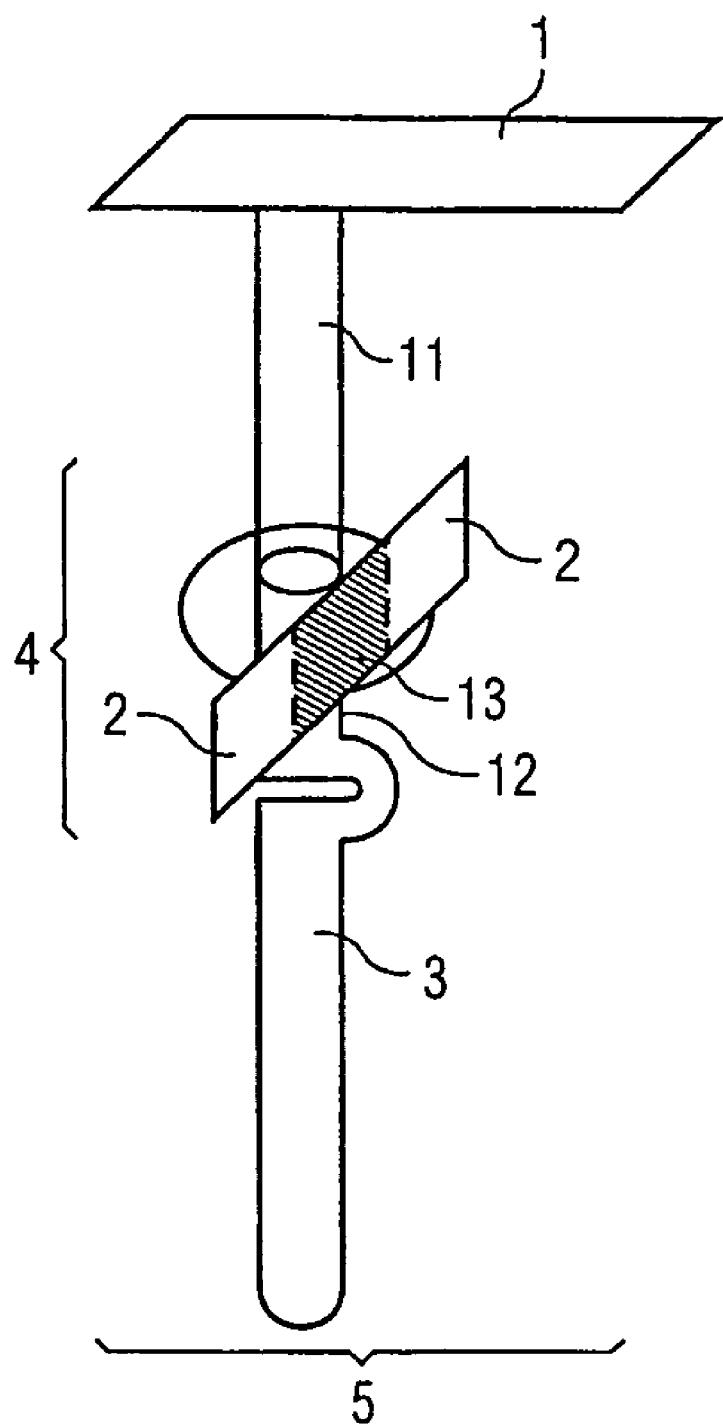
FIG. 1 illustrates a cross sectional view through a vertical memory cell in a semiconductor memory with trench capacitors.

FIG. 1 shows the typical design of a memory cell, which has a storage capacitor arranged in a deep trench, i.e., a trench capacitor 3. In the trench, the vertical selection transistor 4 for the memory cell 5 is arranged above the storage capacitor 3. If the selection transistor is a MOSFET, it has a top source/drain electrode 11 and a bottom source/drain electrode 12, between which a channel region is arranged. Running at the side next to the channel region is a word line 2, which forms the gate electrode of the selection transistor. The gate electrode and the channel region have a thin insulator layer arranged between them, and electrical induction allows a channel to be formed, which turns on the transistor and charges or discharges the capacitor 3.

The top electrode 11 is connected to a bit line 1, which runs at right angles to the word line 2 over the substrate surface.

Figure 2:
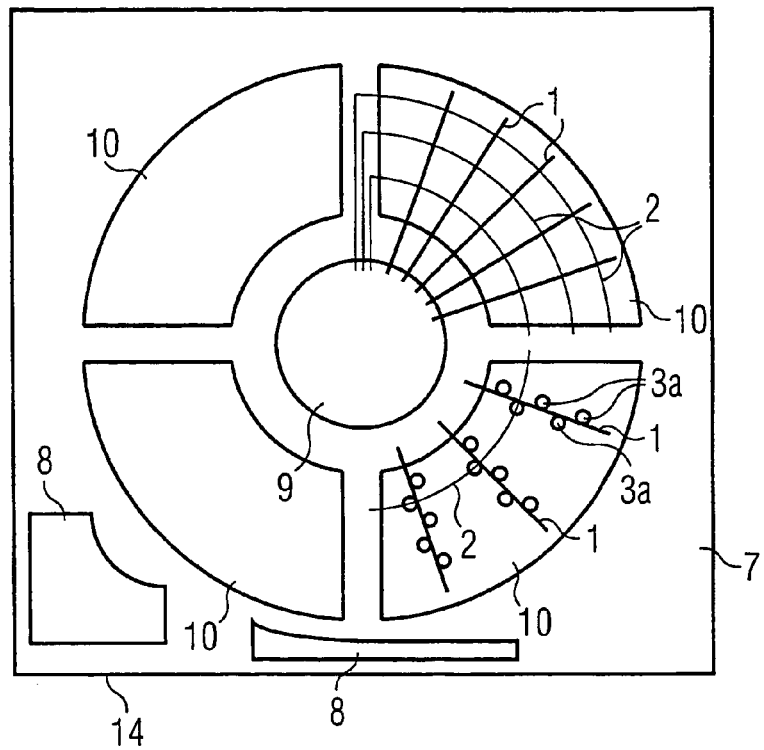
FIG. 2 illustrates a plan view of a first embodiment of a semiconductor memory in accordance with the invention.

Several memory cells, shown in cross-section in FIG. 1, can be present on a semiconductor memory. Referring to FIG. 2, a semiconductor memory with a centrally arranged logic area 9 can be surrounded by a total of four memory areas 10. As an alternative, other memory areas 10 can be provided. Each memory area 10 can have first lines 1, which can be bit lines (or word lines), for example, and which can radially diverge from the logic area 9 through the respective memory area 10. The second lines 2, for example, word lines (or bit lines), can run in arcuately curved fashion and can be connected to the logic area 9 in narrow surface regions between mutually adjacent arcuate memory cell arrays. Along one of these lines, either the divergent lines or the curved lines, the memory cells can have an alternate lateral offset, as indicated in FIG. 2 by the storage capacitors 3a. These are situated in the bottom right-hand memory area 10 in FIG. 2, alternately on the left and right of the first line 1, to which they are connected.

FIG. 2 shows two further logic areas 8 (not surrounded by memory areas) on the semiconductor substrate 7, which are arranged between a memory area 10 and an edge 14 of the semiconductor substrate. These further logic areas can be arranged at a chip edge and in one corner of a semiconductor chip. The further logic areas can be arranged between mutually adjacent memory areas. These logic areas 8 and 9 form subregions of a logic circuit, which can be used for operating the semiconductor memory, particularly for actuating the memory cell arrays 10. Those subregions 9 of the logic circuit from which the connection to all memory cell arrays 10 can be as relatively uniformly short as possible can be arranged in the center of the semiconductor chip.

Figure 4:
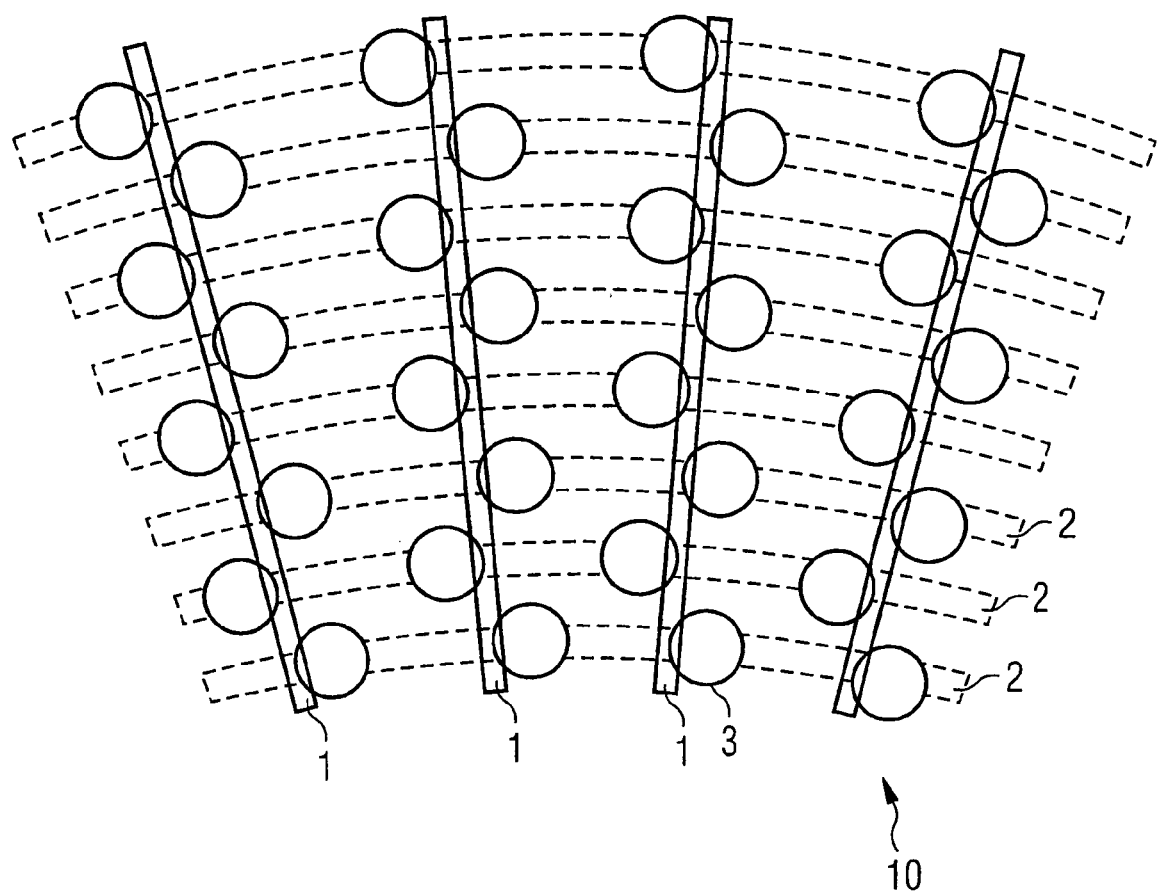
FIG. 4 illustrates a detailed view of the first embodiment of the semiconductor memory in accordance with the invention.

FIG. 4 illustrates along the divergent first lines 1, the storage capacitors 3 can be offset alternately on the left and right of the respective line 1 can be compressed along this line 1 on account of their lateral offset. As a result, the radially divergent lines can actuate even more memory cells over short distances. Signals running along the lines 1 can therefore be subject to particularly short signal delay times, which are additionally very homogeneous.

Figure 3:
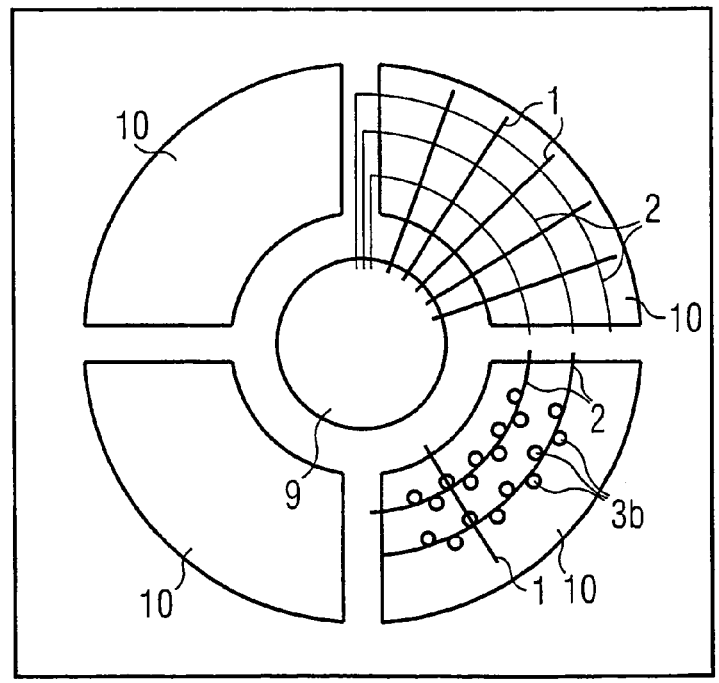
FIG. 3 illustrates a plan view of a second embodiment of a semiconductor memory in accordance with the invention.

FIG. 3 illustrates another embodiment of a semiconductor memory in accordance with the invention, in which, as indicated in the bottom right-hand memory area 10, the storage capacitors 3b for the memory cells can be compressed along the curved second lines 2 and are laterally offset with respect thereto.

FIG. 5 illustrates an enlarged detailed view of a memory area from FIG. 2. Bit lines 1 can run divergently with respect to one another and can be crossed by curved second lines 2, as in FIG. 4. Mutually adjacent first lines, for example, bit lines BL1O, BL11, can enclose an angle W, which is smaller than in FIG. 4, since the capacitors 3 can be arranged to be compressed by lateral offsets along the curved lines 2, for example, the word lines WL1 to WL4. Hence, the arcuately running word lines can also make contact with a relatively large number of memory cells on a relatively short annular circumference or arcuate section, which means that the signal delays along the second lines are relatively homogeneous.

The interconnection of the memory cells can be different in FIGS. 4 and 5. Each word line 2 in FIG. 5 can be connected to two rows of memory cells 5, which can curved concentrically with respect to the word line. The memory cells 3 can be connected to a respective single word line 2 can be arranged in the form of a zigzag line to be offset alternately above and below the word line in FIG. 5, i.e., offset with respect to the word line 2 on the left and right thereof in relation to the substrate surface. As a result, one word line can actuate more memory cells per word line length than in the case of a conventional semiconductor memory. In a conventional semiconductor memory, two memory cells 5a, which can be connected to the same bit line BL11 and can be adjacent to one another along this bit line BL11, can be connected to different word lines 2, which are most closely adjacent to one another, in figure 5 too, which means that the inventive semiconductor memory can be used for actuating just a single memory cell in each case. The storage capacitors for the memory cells 5a can be connected to a particular single bit line and can be arranged to be offset either on the right or on the left of the word line, which is connected to them.

In FIG. 4, the divergent lines and the curved lines have been swapped, in terms of the arrangement of the storage capacitors, as compared with FIG. 5.

In particular, the invention can be used for designing volatile semiconductor memories, such as DRAMs.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

List of Reference Symbols

1 First line
2 Second line
3, 3a, 3b Storage capacitor
4 Selection transistor
5, 5a Memory cell
7 Semiconductor substrate
8 Further logic area
9 Logic area
10 Memory cell array
11 Top source/drain electrode
12 Bottom source/drain electrode
13 Gate electrode
14 Edge of the semiconductor substrate

What is claimed is:

1. A semiconductor memory, comprising:
a plurality of memory cells forming at least one memory cell array, the memory cells being connected to first lines and to second lines, the second lines crossing the first lines, each memory cell having a storage capacitor and a selection transistor, wherein the first lines run divergently with respect to one another, the second lines are curved, a memory cell is connected at each crossing point between a first line and a second line, each of the first lines has memory cells connected thereon, and respective storage capacitors are laterally offset alternately on each side of the respective first lines.

2. The semiconductor memory as claimed in claim 1, wherein the first lines extend divergently from a logic area to the memory cells in at least one memory cell array.

3. The semiconductor memory as claimed in claim 1, wherein the at least one memory cell array forms an annular portion, the first lines diverging radially, and the second lines curving arcuately.

4. The semiconductor memory as claimed in claim 1, wherein one or more memory cell arrays surround a logic area annularly.

5. The semiconductor memory as claimed in claim 1, wherein the first lines are bit lines and the second lines are word lines.

6. The semiconductor memory as claimed in claim 1, wherein the first lines are word lines and the second lines are bit lines.

7. The semiconductor memory as claimed in claim 1, wherein one of the first and second lines are bit lines and the other of the first and second lines are word lines and two memory cells are connected to two mutually adjacent bit lines and to the same word line, the two memory cells having respective storage capacitors adjacent to one another along the same word line.

8. The semiconductor memory as claimed in claim 1, wherein the storage capacitors are trench capacitors buried in a semiconductor substrate.

9. The semiconductor memory as claimed in claim 4, wherein at least one further logic area is provided on a semiconductor substrate and is arranged between a memory area and an edge of the semiconductor substrate, the further logic area not being surrounded by memory areas.

10. The semiconductor memory as claimed in claim 1, wherein the first lines or the second lines are word lines and the selection transistors are vertical field effect transistors whose gate electrodes are connected to the word lines.

11. The semiconductor memory as claimed in claim 1, wherein the semiconductor memory is a dynamic read/write memory.

12. The semiconductor memory as claimed in claim 1, wherein the first lines run divergently in non-parallel directions along their extent.

13. The semiconductor memory as claimed in claim 1, wherein the first lines are continuously divergent along their extent.

14. The semiconductor memory as claimed in claim 1, wherein the second lines extend along concentric arcs.

15. A semiconductor memory, comprising:

a plurality of memory cells forming at least one memory cell array, the memory cells being connected to first lines and to second lines, the second lines crossing the first lines, each memory cell having a storage capacitor and a selection transistor, wherein the first lines run divergently with respect to one another, the second lines are curved, a memory cell is connected at each crossing point between a first line and a second line, each of the second lines has memory cells connected thereon, and respective storage capacitors are laterally offset alternately on each side of the respective second lines.

16. The semiconductor memory as claimed in claim 15, wherein the first lines extend divergently from a logic area to the memory cells in at least one memory cell array.

17. The semiconductor memory as claimed in claim 15, wherein the at least one memory cell array forms an annular portion, the first lines diverging radially, and the second lines curving arcuately.

18. The semiconductor memory as claimed in claim 15, wherein one or more memory cell arrays surround a logic area annularly.

19. The semiconductor memory as claimed in claim 15, wherein the first lines are bit lines and the second lines are word lines.

20. The semiconductor memory as claimed in claim 15, wherein the first lines are word lines and the second lines are bit lines.

21. The semiconductor memory as claimed in claim 15, wherein one of the first and second lines are bit lines and the other of the first and second lines are word lines and two memory cells are connected to two mutually adjacent bit lines and to the same word line, the two memory cells having respective storage capacitors adjacent to one another along the same word line.

22. The semiconductor memory as claimed in claim 15, wherein the storage capacitors are trench capacitors buried in a semiconductor substrate.

23. The semiconductor memory as claimed in claim 18, wherein at least one further logic area is provided on a semiconductor substrate and is arranged between a memory area and an edge of the semiconductor substrates the further logic area not being surrounded by memory areas.

24. The semiconductor memory as claimed in claim 15, wherein the first lines or the second lines are word lines and the selection transistors are vertical field effect transistors whose gate electrodes are connected to the word lines.

25. The semiconductor memory as claimed in claim 15, wherein the semiconductor memory is a dynamic read/write memory.

26. The semiconductor memory as claimed in claim 15, wherein the first lines run divergently in non-parallel directions along their extent.

27. The semiconductor memory as claimed in claim 15, wherein the first lines are continuously divergent along their extent.

28. The semiconductor memory as claimed in claim 15, wherein the second lines extend along concentric arcs.

29. A semiconductor memory, comprising:

a centrally-located logic area for operating the semiconductor memory;

at least one memory array surrounding the logic area;

first lines extending outward from the logic area into the at least one memory array;

second lines extending through the at least one memory array along a periphery of the logic area and arranged concentrically with respect to the logic area such that the first and second lines form a non-rectangular array of crossing points; and a plurality of memory cells coupled to the first and second lines at the crossing points, the memory cells including storage capacitors laterally offset alternately on each side of respective first lines or respective second lines.

* * * * *